(12) United States Patent
Karami et al.

(10) Patent No.: US 12,375,091 B1
(45) Date of Patent: Jul. 29, 2025

(54) OSCILLATOR AMPLITUDE CALIBRATION

(71) Applicant: Cadence Design Systems, Inc., San Jose, CA (US)

(72) Inventors: Mohammadamin Karami, East Gwillimbury (CA); Navid Yaghini, Pickering (CA); Hemesh Yasotharan, Toronto (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 18/533,753

(22) Filed: Dec. 8, 2023

Related U.S. Application Data

(60) Provisional application No. 63/432,185, filed on Dec. 13, 2022.

(51) Int. Cl.
*H03L 7/093* (2006.01)
*H03B 5/12* (2006.01)
*H03L 7/099* (2006.01)

(52) U.S. Cl.
CPC .............. *H03L 7/093* (2013.01); *H03B 5/12* (2013.01); *H03L 7/099* (2013.01)

(58) Field of Classification Search
CPC ............ H03L 7/093; H03L 7/099; H03B 5/12
USPC .............................. 331/185, 74, 167, 117 FE
See application file for complete search history.

(56) References Cited

U.S. PATENT DOCUMENTS

| | | | | |
|---|---|---|---|---|
| 6,121,849 A * | 9/2000 | McCollough | ......... | H03L 7/0807 331/34 |
| 7,327,201 B2 * | 2/2008 | Miyashita | .................. | H03L 5/00 331/185 |
| 7,616,074 B2 * | 11/2009 | Toffolon | .............. | H03B 5/1271 331/158 |
| 2003/0098749 A1 * | 5/2003 | Terasawa | ............. | H03K 5/1565 331/74 |

\* cited by examiner

*Primary Examiner* — Arnold M Kinkead
(74) *Attorney, Agent, or Firm* — Mark H. Whittenberger; Holland & Knight LLP

(57) ABSTRACT

Multiple voltage amplitudes for an oscillator in a phase-locked loop may be selected to meet various design goals/criteria (e.g., frequency range of operation, jitter, power consumption, etc.). These multiple voltage amplitudes may be stored in a lookup table memory that relates frequency ranges to reference voltages. A reference voltage for a particular oscillator may then be selected and generated. A feedback loop may compare the amplitude output by the oscillator to the reference voltage and adjusts a bias current of the oscillator with the goal of substantially equalizing the oscillator output to the reference voltage.

18 Claims, 6 Drawing Sheets

RECEIVE, FROM A MEMORY ON AN INTEGRATED CIRCUIT, A FIRST TARGET AMPLITUDE VALUE
402

GENERATE A FIRST REFERENCE VOLTAGE BASED ON THE FIRST TARGET AMPLITUDE VALUE
404

PRODUCE A FIRST OUTPUT AMPLITUDE INDICATOR VOLTAGE FROM A FIRST OUTPUT SIGNAL OF A FIRST INDUCTOR-CAPACITOR (LC) TANK OSCILLATOR
406

ADJUST A FIRST CURRENT BIAS OF THE FIRST LC TANK OSCILLATOR BASED ON A FIRST COMPARISON OF THE FIRST REFERENCE VOLTAGE AND THE FIRST OUTPUT AMPLITUDE INDICATOR VOLTAGE.
408

*FIG. 4*

OSCILLATOR AMPLITUDE CALIBRATION

RELATED APPLICATION(S)

This application claims the benefit of U.S. Provisional Application No. 63/432,185, filed 13 Dec. 2022, the entire contents of which is incorporated herein by reference.

BACKGROUND OF INVENTION

A traditional phase-locked loop (PLL) architecture contains a frequency divider (divide-by-N), a phase detector (PD)/charge-pump (CP), a loop filter (LF), and a voltage-controlled oscillator (VCO). PLLs are widely employed in radio, telecommunications, computers, and other electronic applications. For example, PLLs may be used to demodulate a signal, recover a signal from a noisy communication channel, or distribute precisely timed clock pulses in digital logic circuits such as microprocessors. Since a single integrated circuit (IC) can provide a complete phase-locked-loop building block, such a technique can be used in electronic devices, with output frequencies from a fraction of a hertz (Hz) up to gigahertz (GHz).

SUMMARY

In one or more embodiments of the present disclosure, an integrated circuit is provided. The circuit may include an inductor-capacitor (LC) tank oscillator having an output signal and a bias current control input. The circuit may further include feedback circuitry to, based on a reference voltage indicator received from a lookup table, adjust the bias current control input to minimize a difference between a reference voltage based on the reference voltage indicator and an indicator of the magnitude of the output signal.

One or more of the following features may be included. In some embodiments, the reference voltage may be generated by a digital-to-analog converter that receives the reference voltage indicator. The indicator of the magnitude of the output signal may be generated using rectifier circuitry. The bias current control input may receive a multi-bit digital value. The multi-bit digital value may be thermometer coded. The circuit may include a comparator receiving the reference voltage and the indicator of the magnitude of the output signal and producing a comparator output signal and calibration circuitry to receive the comparator output signal and to, based on the comparator output signal, adjust the multi-bit digital value to minimize the difference between the reference voltage based on the reference voltage indicator and an indicator of the magnitude of the output signal.

In one or more embodiments of the present disclosure, a method is provided. The method may include receiving, from a memory on an integrated circuit, a first target amplitude value and generating a first reference voltage based on the first target amplitude value. The method may further include producing a first output amplitude indicator voltage from a first output signal of a first inductor-capacitor (LC) tank oscillator. The method may also include adjusting a first current bias of the first LC tank oscillator based on a first comparison of the first reference voltage and the first output amplitude indicator voltage.

One or more of the following features may be included. In some embodiments, the method may include receiving, from the memory on the integrated circuit, a second target amplitude value that is not equal to the first target amplitude value and generating a second reference voltage based on the second target amplitude value. The method may also include producing a second output amplitude indicator voltage from a second output signal of a second inductor-capacitor (LC) tank oscillator and adjusting a second current bias of the second LC tank oscillator based on a second comparison of the second reference voltage and the second output amplitude indicator voltage. The first output amplitude indicator voltage may be produced by a rectification of the first output signal. The first comparison of the first reference voltage and the first output amplitude indicator voltage may be produced by a first comparator and is manifested as a first comparator output signal. The adjusting of the first current bias may be done to minimize a difference between the first reference voltage and the first output amplitude indicator voltage. The first current bias may be adjusted using a multi-bit digital value. The multi-bit digital value may be thermometer encoded. The first LC tank oscillator may be part of a first phase-locked loop and the second LC tank oscillator is part of a second phase-locked loop.

In one or more embodiments of the present disclosure, an integrated circuit is provided. The circuit may include a memory to provide a first reference voltage indicator and a first phase-locked loop. The first phase-locked loop may include an inductor-capacitor (LC) tank oscillator having an output signal and a bias current control input and feedback circuitry to, based on the first reference voltage indicator received from the memory, adjust a bias current control input signal to minimize a difference between a reference voltage based on the reference voltage indicator and an indicator of the magnitude of the output signal.

One or more of the following features may be included. In some embodiments, the circuit may include a second phase-locked loop, the memory to provide the second phase-locked loop with a second reference voltage indicator. The circuit may also include rectifier circuitry to produce the indicator of the magnitude of the output signal. The circuit may further include digital-to-analog converter circuitry that receives the reference voltage indicator and produces the reference voltage based on the reference voltage indicator. The first reference voltage indicator may be selected based on a first performance goal for the first phase-locked loop. The second reference voltage indicator may be selected based on a second performance goal for the second phase-locked loop.

BRIEF DESCRIPTION OF THE DRAWINGS

FIG. 4 is a flowchart illustrating a method of bias current adjustment.

DETAILED DESCRIPTION OF THE EMBODIMENTS

In some embodiments, multiple voltage amplitudes for an oscillator in a phase-locked loop are selected to meet various design goals/criteria (e.g., frequency range of operation, jitter, power consumption, etc.). These multiple voltage amplitudes are stored in a lookup table memory that relates frequency ranges to reference voltages. A reference voltage for a particular oscillator is then selected and generated. A feedback loop compares the amplitude output by the oscillator to the reference voltage and adjusts a bias current of the oscillator with the goal of substantially equalizing the oscillator output to the reference voltage.

Figure 1:
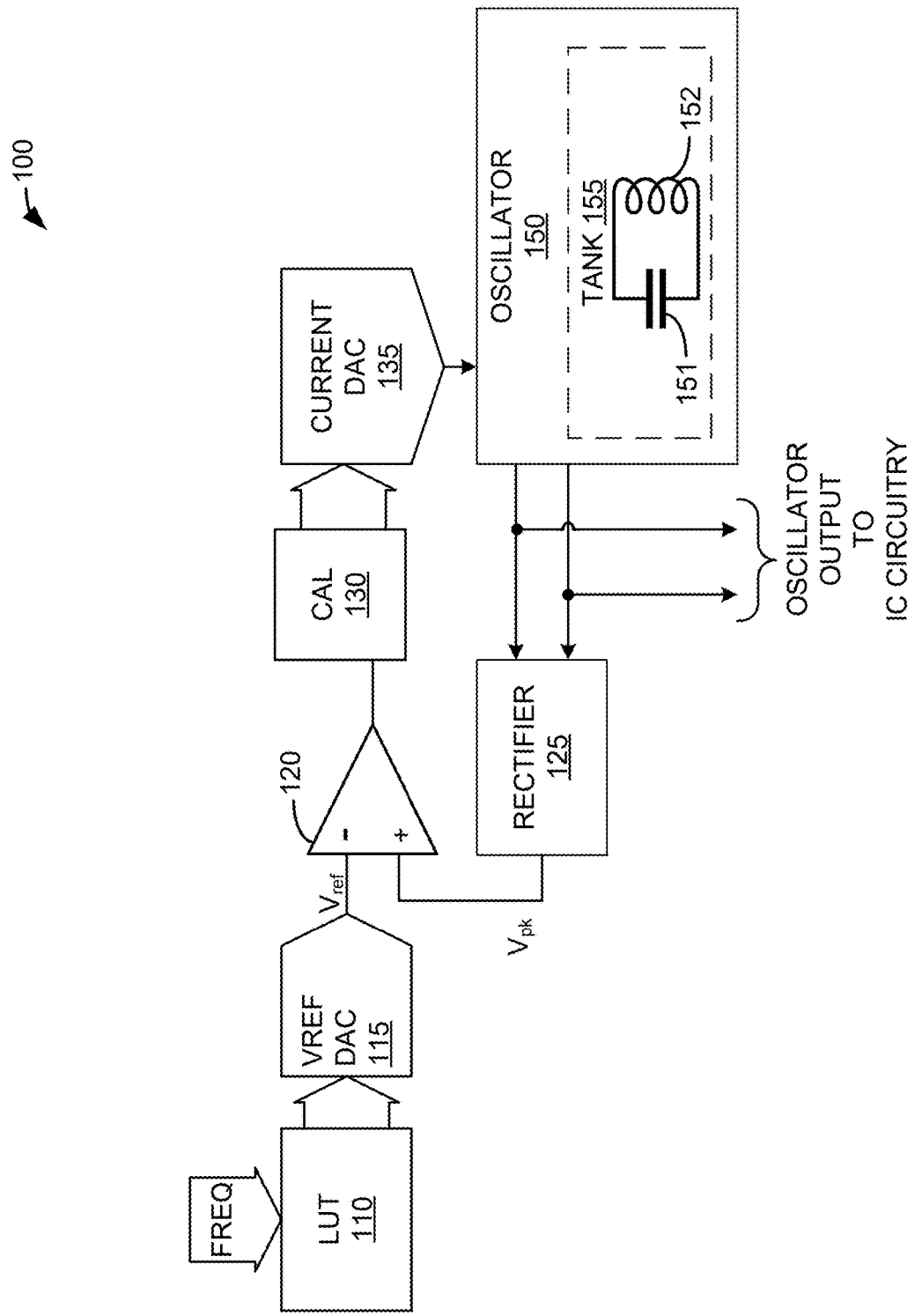
FIG. 1 is a block diagram illustrating an oscillator with amplitude calibration circuitry.

FIG. 1 is a block diagram illustrating an oscillator with amplitude calibration circuitry. In FIG. 1, oscillator calibration circuitry 100 comprises lookup table 110 (e.g., a memory), reference voltage digital-to-analog converter (DAC) 115, comparator 120, rectifier circuitry 125, calibration control circuitry 130, current DAC 135, and inductor-capacitor (LC) tank oscillator circuitry 150. LC tank oscillator circuitry 150 includes tank circuitry 155. Tank circuitry 155 includes capacitor 151 and inductor 152. In an embodiment, all of the elements of oscillator calibration circuitry 100 are disposed on an integrated circuit except for inductor 152 which is external to the integrated circuit. In an embodiment, oscillator circuitry 150 is part of phase-locked loop circuitry (not shown in FIG. 1).

In FIG. 1, lookup table 110 receives a frequency range indicator (FREQ—e.g., address, index, etc.). Based on the frequency range indicator, lookup table 110 produces a reference voltage indicator (e.g., digital value) that is provided to reference voltage DAC 115. Based on the reference voltage indicator output by lookup table 110, DAC 115 produces an analog reference voltage ($V_{ref}$) that is provided to the inverting input of comparator 120. The noninverting input of comparator 120 receives an analog voltage that indicates the magnitude of the output signal of oscillator circuitry 150 from rectifier circuitry 125. Rectifier circuitry 125 produces the indicator of the magnitude of the output signal of oscillator circuitry 150 from the output signal received from oscillator circuitry 150. In an embodiment, rectifier circuitry 125 comprises full wave rectifier circuitry.

In some embodiments, the output of comparator 120 may be provided to calibration control circuitry 130. The output of comparator 120 may indicate whether the indicator of the magnitude of the output signal of oscillator circuitry 150 is greater than, or less than, the reference voltage from DAC 115. Based on the outputs of comparator 120, calibration control circuitry adjusts a multi-bit digital output value provided to current DAC 135 that controls the amount of bias current being provided oscillator circuitry 150 by current DAC 135. The amount of bias current being provided oscillator circuitry 150 may determine the magnitude of the output signal of oscillator circuitry 150.

In an embodiment, the multi-bit digital output value provided to current DAC 135 may be thermometer encoded. In this embodiment, each bit of the multi-bit digital output value provided to current DAC 135 controls whether a switching device is conducting or not conducting thereby determining the amount of current being provided by current DAC 135.

Thus, it should be understood that oscillator circuitry 150, rectifier circuitry 125, comparator 120, calibration control circuitry 130, and/or current DAC 135 form a feedback control loop that has the goal of substantially equalizing the voltage magnitude of oscillator circuitry 150's output to the reference voltage. Since the reference voltage is based on values from lookup table 110, lookup table 110 may be configured to calibrate various performance parameters (e.g., jitter, current consumption, varactor/frequency range, etc.) of oscillator circuitry 150. For example, different instances of oscillator calibration circuitry 100 (and oscillator circuitry 150, in particular) may be used with different inductor 152 values. By selecting a corresponding frequency range indicators to be provided to lookup table 110, these different instances of oscillator circuitry 150 with different inductor 152 values may be calibrated to have different output amplitudes while achieving desired jitter, varactor range, and/or current consumption (e.g., minimize current consumption while meeting other parameters).

Table 1 relates example lookup values and resultant current bias (or consumption) illustrative of information that lookup table 110 may be configured to provide.

TABLE 1

| Frequency range indicator | Reference voltage indicator | Resulting bias current |
|---|---|---|
| 0 (corresponds to range around 1.6e10 Hz) | 5 (corresponds to 0.42 V) | 17 mA |
| 1 (corresponds to range around 1.2e10 Hz) | 1 (corresponds to 0.37 V) | 15 mA |
| 2 (corresponds to range around 1.0e10 Hz) | 6 (corresponds to 0.43 V) | 17 mA |
| 3 (corresponds to range around 8.0e9 Hz) | 8 (corresponds to 0.45 V) | 18 mA |

Figure 2:
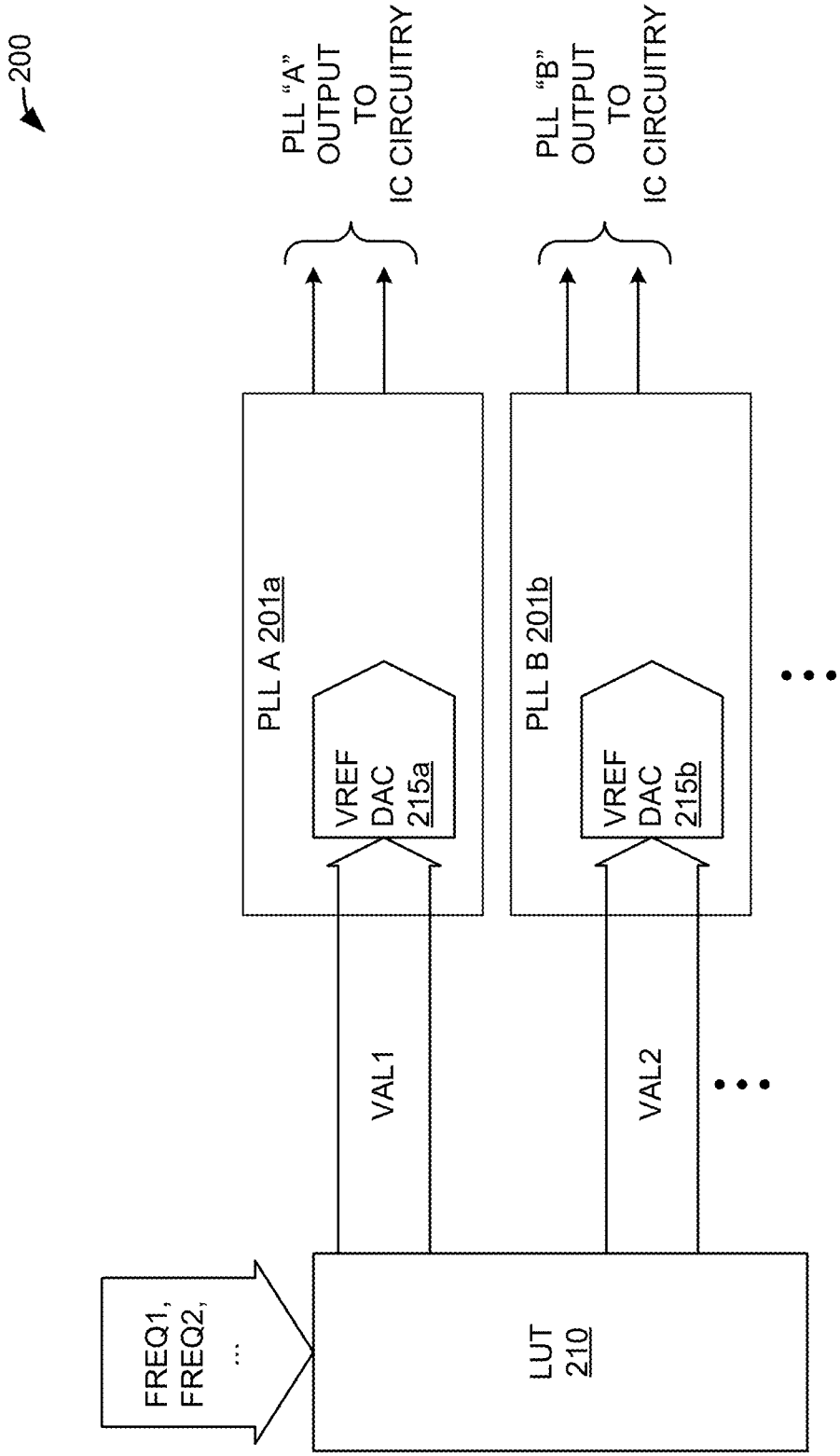
FIG. 2 is a block diagram illustrating an integrated circuit having phase-locked loops.

FIG. 2 is a block diagram illustrating an integrated circuit having phase-locked loops. In FIG. 2, integrated circuit 200 comprises a plurality of phase locked loops (PLLs) 201a-201b and lookup table 210 (e.g., a memory). PLL 210a includes reference voltage DAC 215a. PLL 210b includes reference voltage DAC 215b. Reference voltage DACs 215a-215b represent reference voltage DAC 115 in different instances of oscillator calibration circuitry 100 that are parts of PLLs 201a-201b.

In FIG. 2, lookup table 210 is provided with a first frequency range indicator (FREQ1) to set the amplitude of PLL 201a and second frequency range indicator (FREQ2) to set the amplitude of PLL 201b. Based on the first frequency range indicator, lookup table 210 provides DAC 215a of PLL 201a with a first reference voltage indicator (VAL1). Based on the second frequency range indicator, lookup table 210 provides DAC 215b of PLL 201b with a second reference voltage indicator (VAL2). In an embodiment, VAL1 is not equal to VAL2.

Thus, it should be understood that lookup table 210 may be configured to calibrate various performance parameters (e.g., jitter, current consumption, varactor/frequency range, etc.) of PLL 201a via its instance of oscillator circuitry 150 and calibrate different performance parameters of PLL 201b via its instance of oscillator circuitry 150. For example, the different instances of oscillator calibration circuitry 100 (and oscillator circuitry 150, in particular) may be used with different inductor 152 values. By selecting a corresponding frequency range indicators to be provided by lookup table 210, these different instances of oscillator circuitry 150 with different inductor 152 values may be calibrated to have different output amplitudes while achieving desired jitter, varactor range, and/or current consumption (e.g., minimize current consumption while meeting other parameters) for PLLs 201a-201b.

Figure 3:
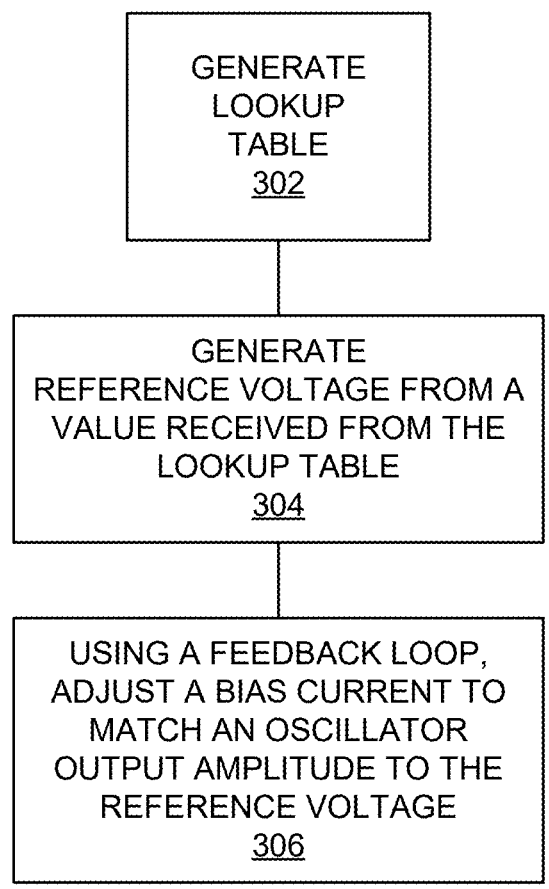
FIG. 3 is a flowchart illustrating a method of amplitude calibration.

FIG. 3 is a flowchart illustrating a method of amplitude calibration. One or more of the steps illustrated in FIG. 3 may be performed by, for example, oscillator calibration circuitry 100, integrated circuit 200, and/or their components. A lookup table may be generated (302). For example, system designers, manufacturers, or customers may, via simulation and/or measurement, populate, select, or configure a lookup table relating frequency range indicators to reference voltage indicators (e.g., digital values to be provided to DAC 115).

In some embodiments, a reference voltage may be generated from a value received from the lookup table (304). For example, based on a frequency range indicator, lookup table 110 may produce a reference voltage indicator (e.g., digital value) that is provided to reference voltage DAC 115. Based on the reference voltage indicator output by lookup table 110, DAC 115 may produce an analog reference voltage ($V_{ref}$).

In some embodiments, using a feedback loop, a bias current may be adjusted to match an oscillator output amplitude to the reference voltage (306). For example, the analog reference voltage ($V_{ref}$) may be provided to the inverting input of comparator 120. The noninverting input of comparator 120 may receive, from rectifier circuitry 125, an analog voltage that indicates the magnitude of the output signal of oscillator circuitry 150. The output of comparator 120 may be provided to calibration control circuitry 130. Based on the output of comparator 120, calibration control circuitry may adjust a multi-bit digital output value provided to current DAC 135 with the goal of matching the oscillator output amplitude to the reference voltage.

FIG. 4 is a flowchart illustrating a method of bias current adjustment. One or more of the steps illustrated in FIG. 4 may be performed by, for example, oscillator calibration circuitry 100, integrated circuit 200, and/or their components. From a memory on an integrated circuit, a first target amplitude value is received (402). For example, from lookup table 110, DAC 115 may receive a value corresponding to a target value for the output amplitude of oscillator circuitry 150.

In some embodiments, a first reference voltage may be generated based on the first target amplitude value (404). For example, DAC 115 may generate, based on the target value for the output amplitude of oscillator circuitry 150, an analog reference voltage that is provided to a first input of comparator 120. A first output amplitude indicator voltage may be produced from a first output signal of a first inductor-capacitor (LC) tank oscillator (406). For example, rectifier circuitry 125 may produce an output amplitude indicator voltage from the output of oscillator circuitry 150. A first current bias of the first LC tank oscillator may be adjusted based on a first comparison of the first reference voltage and the first output amplitude indicator voltage (408). For example, calibration control circuitry 130 may adjust the current output by current DAC 135 based on the comparison of the voltage output by DAC 115 and the voltage output by rectifier circuitry 125 made by comparator 120.

Figure 5:
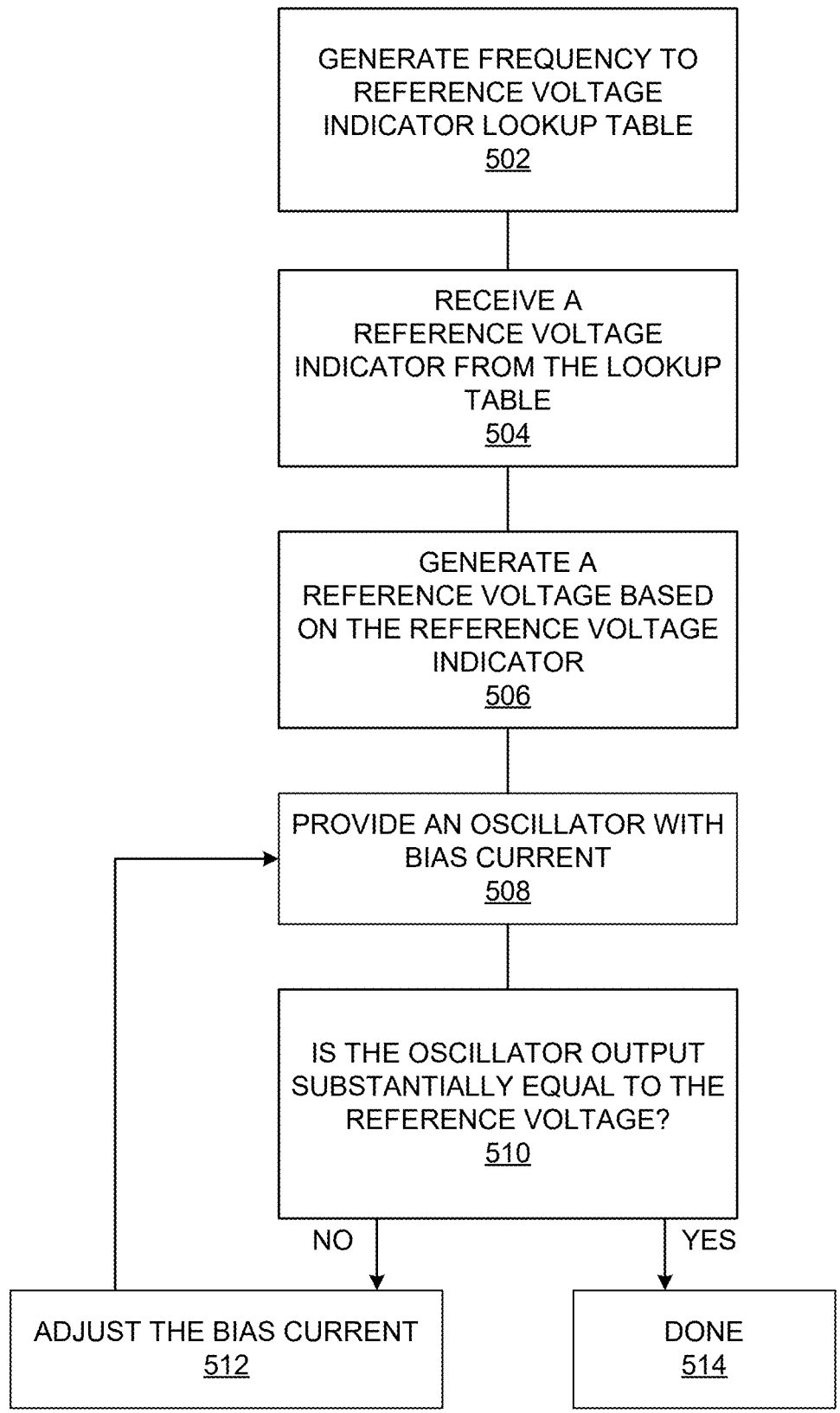
FIG. 5 is a flowchart illustrating a method calibrating the amplitude of a phase-locked loop oscillator.

FIG. 5 is a flowchart illustrating a method calibrating the amplitude of a phase-locked loop oscillator. One or more of the steps illustrated in FIG. 5 may be performed by, for example, oscillator calibration circuitry 100, integrated circuit 200, and/or their components. A frequency to reference voltage indicator lookup table is generated (502). For example, system designers, manufacturers, or customers may, via simulation and/or measurement, populate, select, or configure a lookup table relating frequency range indicators to reference voltage indicators (e.g., digital values to be provided to DAC 115).

In some embodiments, a reference voltage indicator may be received from the lookup table (504). For example, from lookup table 110, DAC 115 may receive a value corresponding to a target value for the output amplitude of oscillator circuitry 150. A reference voltage may be generated based on the reference voltage indicator (506). For example, DAC 115 may generate, based on the target value for the output amplitude of oscillator circuitry 150 received from lookup table 110, an analog reference voltage that is provided to a first input of comparator 120.

In some embodiments, an oscillator may be provided with a bias current (508). For example, current DAC 135 may provide oscillator circuitry 150 a bias current under the control of a first (e.g., minimum) bias current value being received from calibration control circuitry 130. It is determined whether the oscillator output is substantially equal to the reference voltage (510). If the oscillator output is substantially equal to the reference voltage, flow proceeds end in box 514. If the oscillator output is not substantially equal to the reference voltage, flow proceeds to box 512.

In box 512, if the oscillator output was not substantially equal to the reference voltage, the bias current may be adjusted (512). For example, if calibration control circuitry 130, based on the output of comparator 120 determines that the amplitude of the output of oscillator circuitry 150 is substantially not equal to the reference voltage (e.g., by not seeing a transition of comparator 120's output from indicating less than to indicating greater than), calibration control circuitry 130 may increment the value being supplied to current DAC 135. Flow then proceeds back to box 508 where the oscillator is provided with the adjusted bias current.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This may include, but is not limited to one or more elements of oscillator calibration circuitry 100, integrated circuit 200, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 6:
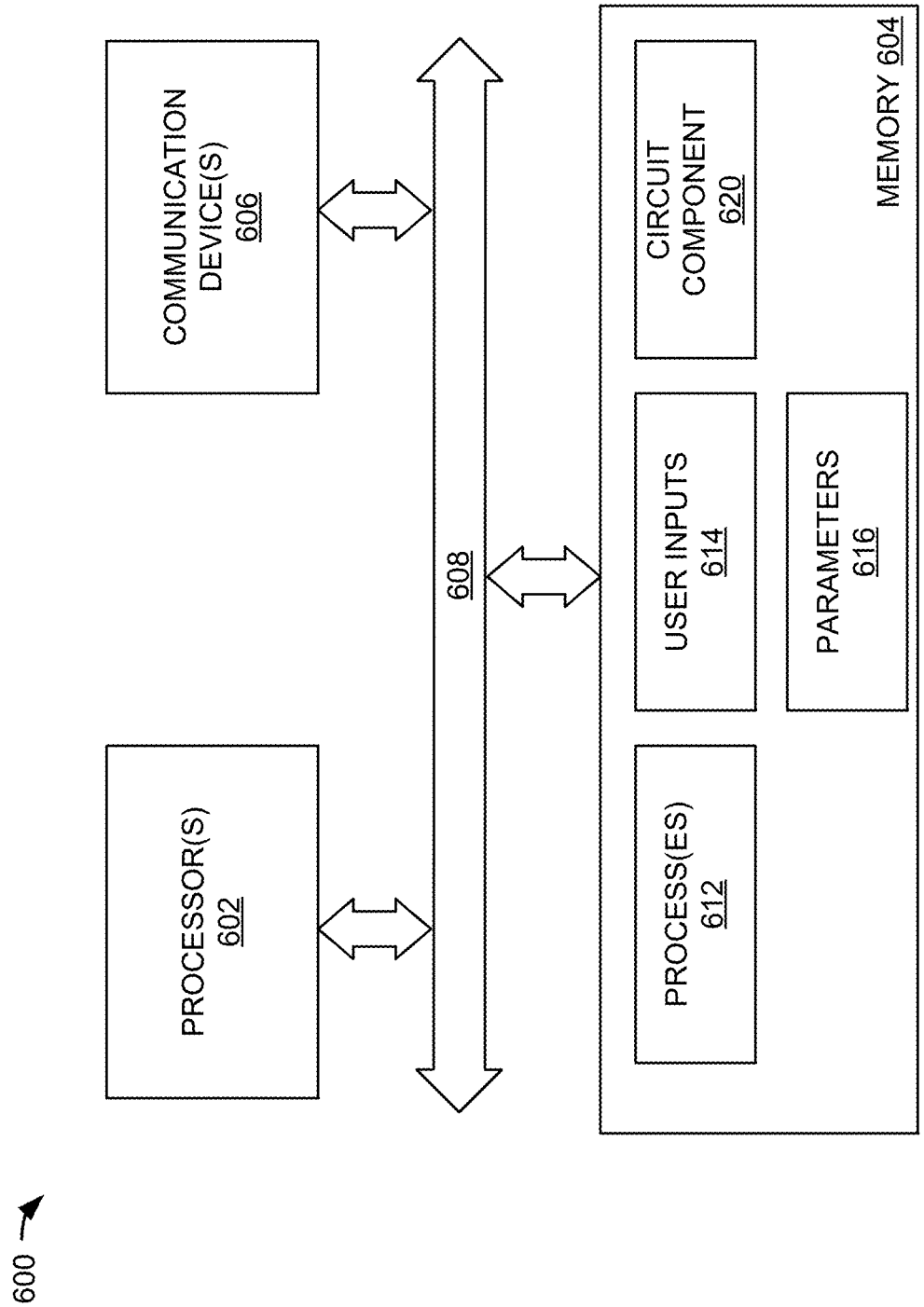
FIG. 6 is a block diagram of a processing system.

FIG. 6 is a block diagram illustrating one embodiment of a processing system 600 for including, processing, or generating, a representation of a circuit component 620. Processing system 600 includes one or more processors 602, a memory 604, and one or more communications devices 606. Processors 602, memory 604, and communications devices 606 communicate using any suitable type, number, and/or configuration of wired and/or wireless connections 608.

Processors 602 execute instructions of one or more processes 612 stored in a memory 604 to process and/or generate circuit component 620 responsive to user inputs 614 and parameters 616. Processes 612 may be any suitable electronic design automation (EDA) tool or portion thereof used to design, simulate, analyze, and/or verify electronic circuitry and/or generate photomasks for electronic circuitry. Representation 620 includes data that describes all or portions of oscillator calibration circuitry 100, integrated circuit 200, and their components, as shown in the Figures.

Representation 620 may include one or more of behavioral, register transfer, logic component, transistor, and layout geometry-level descriptions. Moreover, representation 620 may be stored on storage media or communicated by carrier waves.

Data formats in which representation 620 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email.

User inputs 614 may comprise input parameters from a keyboard, mouse, voice recognition interface, microphone and speakers, graphical display, touch screen, or other type of user interface device. This user interface may be distributed among multiple interface devices. Parameters 616 may include specifications and/or characteristics that are input to help define representation 620. For example, parameters 616 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 604 includes any suitable type, number, and/or configuration of non-transitory computer-readable storage media that stores processes 612, user inputs 614, parameters 616, and circuit component 620.

Communications devices 606 include any suitable type, number, and/or configuration of wired and/or wireless devices that transmit information from processing system 600 to another processing or storage system (not shown) and/or receive information from another processing or storage system (not shown). For example, communications devices 606 may transmit circuit component 620 to another system. Communications devices 606 may receive processes 612, user inputs 614, parameters 616, and/or circuit component 620 and cause processes 612, user inputs 614, parameters 616, and/or circuit component 620 to be stored in memory 604.

Implementations discussed herein include, but are not limited to, the following examples:

Example 1. An integrated circuit, comprising: an inductor-capacitor (LC) tank oscillator having an output signal and a bias current control input; feedback circuitry to, based on a reference voltage indicator received from a lookup table, adjust the bias current control input to minimize a difference between a reference voltage based on the reference voltage indicator and an indicator of the magnitude of the output signal.

Example 2: The integrated circuit of claim 1, wherein the reference voltage is generated by a digital-to-analog converter that receives the reference voltage indicator.

Example 3: The integrated circuit of claim 1, wherein the indicator of the magnitude of the output signal is generated using rectifier circuitry.

Example 4: The integrated circuit of claim 1, wherein the bias current control input receives a multi-bit digital value.

Example 5: The integrated circuit of claim 4, wherein the multi-bit digital value is thermometer coded.

Example 6: The integrated circuit of claim 5, further comprising: a comparator receiving the reference voltage and the indicator of the magnitude of the output signal, and producing a comparator output signal; and calibration circuitry to receive the comparator output signal and to, based on the comparator output signal, adjust the multi-bit digital value to minimize the difference between the reference voltage based on the reference voltage indicator and an indicator of the magnitude of the output signal.

Example 7: A method, comprising: receiving, from a memory on an integrated circuit, a first target amplitude value; generating a first reference voltage based on the first target amplitude value; producing a first output amplitude indicator voltage from a first output signal of a first inductor-capacitor (LC) tank oscillator; and adjusting a first current bias of the first LC tank oscillator based on a first comparison of the first reference voltage and the first output amplitude indicator voltage.

Example 8: The method of claim 7, further comprising: receiving, from the memory on the integrated circuit, a second target amplitude value that is not equal to the first target amplitude value; generating a second reference voltage based on the second target amplitude value; producing a second output amplitude indicator voltage from a second output signal of a second inductor-capacitor (LC) tank oscillator; and adjusting a second current bias of the second LC tank oscillator based on a second comparison of the second reference voltage and the second output amplitude indicator voltage.

Example 9: The method of claim 8, wherein the first output amplitude indicator voltage is produced by a rectification of the first output signal.

Example 10: The method of claim 9, wherein the first comparison of the first reference voltage and the first output amplitude indicator voltage is produced by a first comparator and is manifested as a first comparator output signal.

Example 11: The method of claim 10, wherein the adjusting of the first current bias is done to minimize a difference between the first reference voltage and the first output amplitude indicator voltage.

Example 12: The method of claim 11, wherein the first current bias is adjusted using a multi-bit digital value.

Example 13: The method of claim 12, wherein the multi-bit digital value is thermometer encoded.

Example 14: The method of claim 12, wherein the first LC tank oscillator is part of a first phase-locked loop and the second LC tank oscillator is part of a second phase-locked loop.

Example 15: An integrated circuit, comprising: a memory to provide a first reference voltage indicator; and a first phase-locked loop comprising: an inductor-capacitor (LC) tank oscillator having an output signal and a bias current control input; and feedback circuitry to, based on the first reference voltage indicator received from the memory, adjust a bias current control input signal to minimize a difference between a reference voltage based on the reference voltage indicator and an indicator of the magnitude of the output signal.

Example 16: The integrated circuit of claim 15, further comprising: a second phase-locked loop, the memory to provide the second phase-locked loop with a second reference voltage indicator.

Example 17: The integrated circuit of claim 15, further comprising: rectifier circuitry to produce the indicator of the magnitude of the output signal.

Example 18: The integrated circuit of claim 17, further comprising: digital-to-analog converter circuitry that receives the reference voltage indicator and produces the reference voltage based on the reference voltage indicator.

Example 19: The integrated circuit of claim 18, wherein the first reference voltage indicator is selected based on a first performance goal for the first phase-locked loop.

Example 20: The integrated circuit of claim 19, wherein the second reference voltage indicator is selected based on a second performance goal for the second phase-locked loop.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
   an inductor-capacitor (LC) tank oscillator having an output signal and a bias current control input; and
   feedback circuitry to, based on a reference voltage indicator received from a lookup table, adjust the bias current control input to minimize a difference between a reference voltage based on the reference voltage indicator and an indicator of the magnitude of the output signal, wherein the reference voltage is generated by a digital-to-analog converter that receives the reference voltage indicator.

2. The integrated circuit of claim 1, wherein the indicator of the magnitude of the output signal is generated using rectifier circuitry.

3. The integrated circuit of claim 1, wherein the bias current control input receives a multi-bit digital value.

4. The integrated circuit of claim 3, wherein the multi-bit digital value is thermometer coded.

5. The integrated circuit of claim 4, further comprising:
   a comparator receiving the reference voltage and the indicator of the magnitude of the output signal, and producing a comparator output signal; and
   calibration circuitry to receive the comparator output signal and to, based on the comparator output signal, adjust the multi-bit digital value to minimize the difference between the reference voltage based on the reference voltage indicator and an indicator of the magnitude of the output signal.

6. A method, comprising:
   receiving, from a memory on an integrated circuit, a first target amplitude value;
   generating a first reference voltage based on the first target amplitude value;
   producing a first output amplitude indicator voltage from a first output signal of a first inductor-capacitor (LC) tank oscillator;
   adjusting a first current bias of the first LC tank oscillator based on a first comparison of the first reference voltage and the first output amplitude indicator voltage; and
   receiving, from the memory on the integrated circuit, a second target amplitude value that is not equal to the first target amplitude value;
   generating a second reference voltage based on the second target amplitude value;
   producing a second output amplitude indicator voltage from a second output signal of a second inductor-capacitor (LC) tank oscillator; and
   adjusting a second current bias of the second LC tank oscillator based on a second comparison of the second reference voltage and the second output amplitude indicator voltage.

7. The method of claim 6, wherein the first output amplitude indicator voltage is produced by a rectification of the first output signal.

8. The method of claim 7, wherein the first comparison of the first reference voltage and the first output amplitude indicator voltage is produced by a first comparator and is manifested as a first comparator output signal.

9. The method of claim 8, wherein the adjusting of the first current bias is done to minimize a difference between the first reference voltage and the first output amplitude indicator voltage.

10. The method of claim 9, wherein the first current bias is adjusted using a multi-bit digital value.

11. The method of claim 10, wherein the multi-bit digital value is thermometer encoded.

12. The method of claim 10, wherein the first LC tank oscillator is part of a first phase-locked loop and the second LC tank oscillator is part of a second phase-locked loop.

13. An integrated circuit, comprising: a memory to provide a first reference voltage indicator; and a first phase-locked loop comprising: an inductor-capacitor (LC) tank oscillator having an output signal and a bias current control input; and feedback circuitry to, based on the first reference voltage indicator received from the memory, adjust a bias current control input signal to minimize a difference between a reference voltage based on the first reference voltage indicator and an indicator of the magnitude of the output signal.

14. The integrated circuit of claim 13, further comprising:
   a second phase-locked loop, the memory to provide the second phase-locked loop with a second reference voltage indicator.

15. The integrated circuit of claim 13, further comprising:
   rectifier circuitry to produce the indicator of the magnitude of the output signal.

16. The integrated circuit of claim 15, further comprising:
   digital-to-analog converter circuitry that receives the reference voltage indicator and produces the reference voltage based on the reference voltage indicator.

17. The integrated circuit of claim 16, wherein the first reference voltage indicator is selected based on a first performance goal for the first phase-locked loop.

18. The integrated circuit of claim 17, wherein the second reference voltage indicator is selected based on a second performance goal for the second phase-locked loop.

* * * * *